US011646056B2

(12) United States Patent
Sato

(10) Patent No.: US 11,646,056 B2
(45) Date of Patent: *May 9, 2023

(54) DISK DEVICE WITH IMPROVED CONNECTIVITY

(71) Applicants: Kabushiki Kaisha Toshiba, Tokyo (JP); Toshiba Electronic Devices & Storage Corporation, Tokyo (JP)

(72) Inventor: Yuki Sato, Fujisawa Kanagawa (JP)

(73) Assignees: KABUSHIKI KAISHA TOSHIBA, Tokyo (JP); TOSHIBA ELECTRONIC DEVICES & STORAGE CORPORATION, Tokyo (JP)

( * ) Notice: Subject to any disclaimer, the term of this patent is extended or adjusted under 35 U.S.C. 154(b) by 0 days.

This patent is subject to a terminal disclaimer.

(21) Appl. No.: 17/527,027

(22) Filed: Nov. 15, 2021

(65) Prior Publication Data

US 2022/0076697 A1    Mar. 10, 2022

Related U.S. Application Data

(62) Division of application No. 16/804,384, filed on Feb. 28, 2020, now Pat. No. 11,205,448.

(30) Foreign Application Priority Data

Sep. 19, 2019  (JP) .................... 2019-170065

(51) Int. Cl.
  *G11B 5/48* (2006.01)
  *H05K 1/11* (2006.01)
  (Continued)

(52) U.S. Cl.
  CPC ............ *G11B 5/4853* (2013.01); *G11B 5/486* (2013.01); *H01R 12/61* (2013.01); *H05K 1/116* (2013.01);
  (Continued)

(58) Field of Classification Search
  None
  See application file for complete search history.

(56) References Cited

U.S. PATENT DOCUMENTS 5,055,969 A   10/1991  Putnum
7,095,595 B2   8/2006  Shin
(Continued)

FOREIGN PATENT DOCUMENTS

CN        1417777 A     5/2003
CN      108630235 A    10/2018

*Primary Examiner* — William J Klimowicz
(74) *Attorney, Agent, or Firm* — Allen & Overy LLP

(57) ABSTRACT

A disk device according to one embodiment includes a recording medium, a magnetic head, a wiring member, and a flexible printed circuit board. The magnetic head is configured to read/write information from/to the recording medium. The wiring member includes a plurality of first terminals, and a plurality of first wires that electrically connect the magnetic head to the first terminals. The flexible printed circuit board includes a surface, a plurality of second terminals located on the surface to be connected to the first terminals by means of a conductive adhesive, and a ground plane spaced apart from the second terminals in a direction along the surface.

11 Claims, 6 Drawing Sheets

(51) Int. Cl.
*H01R 12/61* (2011.01)
*H01R 4/04* (2006.01)

(52) U.S. Cl.
CPC ............... *H05K 1/118* (2013.01); *H01R 4/04* (2013.01); *H01R 2201/06* (2013.01); *H05K 2201/09227* (2013.01); *H05K 2201/09409* (2013.01)

(56) References Cited

U.S. PATENT DOCUMENTS

| | | |
|---|---|---|
| 8,004,798 B1 | 8/2011 | Dunn |
| 8,018,737 B2 | 9/2011 | Fujiwara et al. |
| 8,106,303 B2 | 1/2012 | Ishida |
| 8,362,365 B2 | 1/2013 | Ho et al. |
| 8,934,199 B1 | 1/2015 | Pan |
| 10,373,635 B2 | 8/2019 | Kikuchi |
| 11,074,931 B1* | 7/2021 | Aoki .................. G11B 5/484 |
| 2003/0086214 A1 | 5/2003 | Shin |
| 2007/0102490 A1 | 5/2007 | Momokawa et al. |
| 2016/0217814 A1 | 7/2016 | Chen et al. |
| 2018/0235087 A1 | 8/2018 | Uchida et al. |
| 2018/0277150 A1 | 9/2018 | Kikuchi |
| 2019/0295600 A1* | 9/2019 | Yoshikawa .......... G11B 5/4853 |
| 2020/0305280 A1* | 9/2020 | Tokuda .................. H05K 1/118 |

\* cited by examiner

DISK DEVICE WITH IMPROVED CONNECTIVITY

CROSS-REFERENCE TO RELATED APPLICATIONS

This application is a divisional of U.S. application Ser. No. 16/804,384 filed on Feb. 28, 2020 and is based upon and claims the benefit of priority from Japanese Patent Application No. 2019-170065, filed on Sep. 19, 2019; the entire contents of which are incorporated herein by reference.

FIELD

Embodiments described herein relate generally to a disk device.

BACKGROUND

Disk devices such as a hard disk drive (HDD) typically include a magnetic disk and a magnetic head that reads/writes information from/to the magnetic disk. For example, a flexure and a flexible printed circuit board (FPC) serve to electrically connect between a control device for controlling the HDD, and the magnetic head. Terminals of the flexure and terminals of the FPC are interconnected by means of soldering, for example.

Such disk devices may vary in quality depending on the temperature of the solder or the vicinity of the solder at the time of connecting the terminals with the solder.

DETAILED DESCRIPTION

A disk device according to one embodiment includes a recording medium, a magnetic head, a wiring member, and a flexible printed circuit board. The magnetic head is configured to read and write information from and to the recording medium. The wiring member includes a plurality of first terminals, and a plurality of first wires that electrically connect the magnetic head and the plurality of first terminals. The flexible printed circuit board includes a surface, a plurality of second terminals located on the surface to be connected to the plurality of first terminals by means of a conductive adhesive, and a ground plane spaced apart from the plurality of second terminals in a direction along the surface.

First Embodiment

A first embodiment will be described below with reference to FIGS. 1 to 5. In the present specification, constituent elements according to the present embodiment and descriptions of these elements may be represented in multiple forms. The constituent elements and their descriptions are merely exemplary and are not intended to limit the scope of the invention by the descriptions. The constituent elements may be specified by names that differ from those in the present specification. Furthermore, the constituent elements may be represented in a different manner from the present specification.

Figure 1:
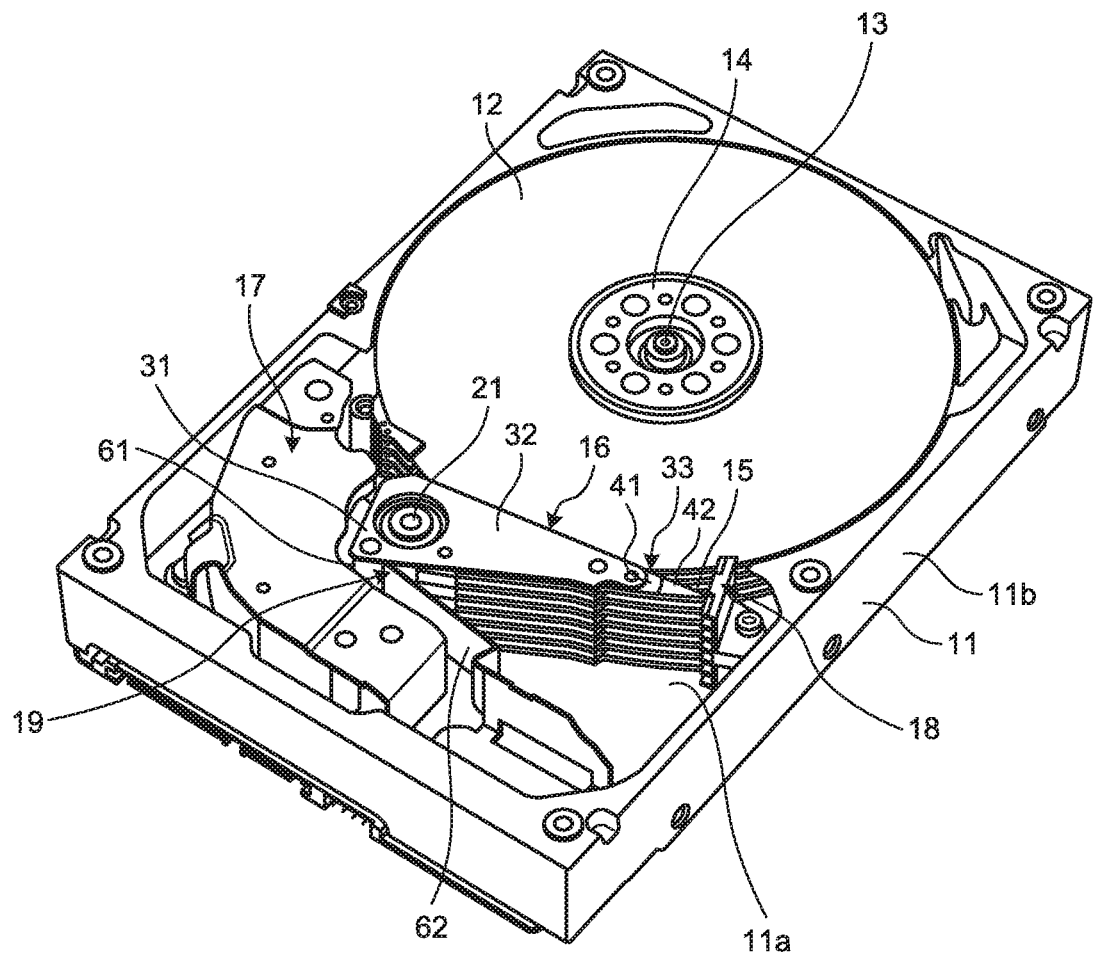
FIG. 1 is an exemplary schematic perspective view of an HDD according to a first embodiment.
Figure 1:

FIG. 1 is an exemplary schematic perspective view of a hard disk drive (HDD) 1 according to the first embodiment. An HDD 1 is an example of a disk device. The disk device is not limited to the HDD 1 and may be another disk device such as a hybrid hard disk drive.

As illustrated in FIG. 1, the HDD 1 includes an housing 11, a plurality of magnetic disks 12, a spindle motor 13, a clamping spring 14, a plurality of magnetic heads 15, an actuator assembly 16, a voice coil motor 17, a ramp-load mechanism 18, and a flexible printed circuit board (FPC) 19. The magnetic disk 12 is an example of a recording medium.

The housing 11 includes a bottom wall 11a of a plate shape and sidewalls 11b that protrude from the bottom wall 11a. The housing 11 also includes a cover attached to the sidewalls 11b and covering the interior of the housing 11. The housing 11 houses at least part of the magnetic disks 12, the spindle motor 13, the clamping spring 14, the magnetic heads 15, the actuator assembly 16, the voice coil motor 17, the ramp-load mechanism 18, and the FPC 19.

The magnetic disk 12 is, for example, a disk including a magnetic recording layer on at least one of an upper surface and a lower surface. The diameter of the magnetic disk 12 is set to 3.5 inches, for example, but it is not limited to this example.

The spindle motor 13 supports and rotates a plurality of magnetic disks 12 placed on the top of each other with spacing. The clamping spring 14 holds the magnetic disks 12 in the hub of the spindle motor 13.

The magnetic heads 15 record and reproduce information on and from the recording layers of the magnetic disks 12. In other words, the magnetic heads 15 read/write information from/to the magnetic disks 12. The magnetic heads 15 are supported by the actuator assembly 16.

The actuator assembly 16 is rotatably supported by a support shaft 21 spaced apart from the magnetic disks 12. The voice coil motor 17 rotates the actuator assembly 16 to a desired position. Along with the rotation of the actuator assembly 16 by the voice coil motor 17, the magnetic heads 15 move to the outermost circumference of the magnetic disks 12, and the ramp-load mechanism 18 holds the magnetic heads 15 in an unload position spaced apart from the magnetic disks 12.

A printed circuit board is attached to the outside of the bottom wall 11a of the housing 11. A control device that controls the spindle motor 13, the magnetic heads 15, and the voice coil motor 17 is mounted on the printed circuit board. The control device is electrically connected to the magnetic heads 15 and the voice coil motor 17 via the FPC 19.

The actuator assembly 16 includes an actuator block 31, a plurality of arms 32, and a plurality of head suspension assemblies 33. The head suspension assemblies 33 can also be referred to as head gimbal assemblies (HGA).

The actuator block 31 is rotatably supported by a support shaft 21 via a bearing, for example. The arms 32 protrude from the actuator block 31 in a direction substantially orthogonal to the support shaft 21. The actuator assembly 16 may be divided into a plurality of actuator blocks 31 so that the arms 32 protrude from the respective actuator blocks 31.

The arms 32 are disposed at intervals along the support shaft 21. The arms 32 have a plate shape to be insertable into two adjacent magnetic disks 12. The arms 32 extend substantially in parallel.

The actuator block 31 and the arms 32 are integrally formed from aluminum, for example. The materials of the actuator block 31 and the arms 32 are not limited to this example.

The voice coil of the voice coil motor 17 is placed on a projection that protrudes from the actuator block 31. The voice coil motor 17 includes a pair of yokes, a voice coil disposed between the yokes, and a magnet located on the yokes.

The head suspension assemblies 33 are attached to the tips of the corresponding arms 32 and protrude from the arms 32. As a result, the head suspension assemblies 33 are disposed at intervals along the support shaft 21.

Figure 2:
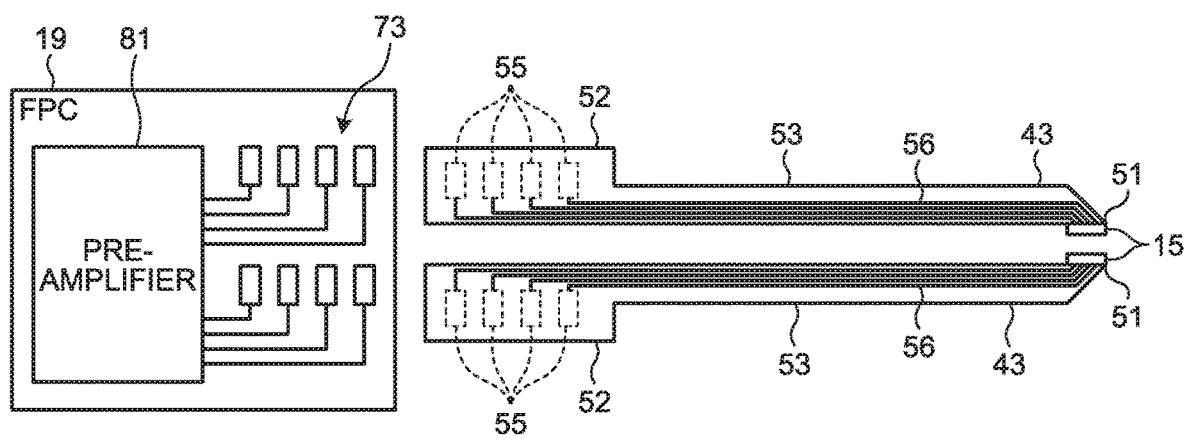
FIG. 2 is an exemplary view schematically illustrating an FPC and flexures according to the first embodiment.

FIG. 2 is an exemplary view schematically illustrating the FPC 19 and flexure 43 according to the first embodiment. The head suspension assemblies 33 each include a base plate 41 and a loading beam 42, which are illustrated in FIG. 1, and the flexure 43 illustrated in FIG. 2. The flexure 43 is an example of a wiring member. In addition, the magnetic heads 15 are attached to the head suspension assemblies 33.

The base plate 41 and the loading beam 42 are made of stainless steel, for example. The materials of the base plate 41 and the loading beam 42 are not limited to this example. The base plate 41 has a plate shape and is attached to the tips of the arms 32. The loading beam 42 has a thinner plate shape than the base plate 41. The loading beam 42 is attached to the tip of the base plate 41 and protrudes from the base plate 41.

As illustrated in FIG. 2, the flexure 43 has a long and narrow belt shape. The shape of the flexure 43 is not limited to this example. The flexure 43 is a multilayered plate including a metal sheet (backing layer) as stainless steel, an insulating layer formed on the metal sheet, a conductive layer constituting a plurality of wires (wiring patterns) on the insulating layer, and a protective layer (insulating layer) covering the conductive layer. The flexure 43 includes a first attachment 51, a second attachment 52, and a middle part 53.

The first attachment 51 is provided at one end of the flexure 43. The second attachment 52 is provided at the other end of the flexure 43. The middle part 53 extends between the first attachment 51 and the second attachment 52.

The first attachment 51 is attached to the base plate 41 and the loading beam 42. The first attachment 51 is located above the loading beam 42 and includes a displaceable gimbal (elastic support). The magnetic heads 15 are mounted on the gimbal.

The middle part 53 overhangs from the first attachment 51 to outside the side edge of the base plate 41. The middle part 53 extends toward the actuator block 31 along the side edges of the arms 32 outside the base plate 41.

The second attachment 52 has a rectangular shape, extending in the longitudinal direction of the middle part 53. The second attachment 52 is bent substantially orthogonal to the middle part 53. The second attachment 52 is equipped with a plurality of pads 55. The pads 55 are an example of first terminals. The pads 55 are arranged at intervals in the longitudinal direction of the second attachment 52.

Each flexure 43 further includes a plurality of wires 56. The wires 56 are an example of first wires. The wires 56 are laid on a conductive layer of the flexure 43. The wires 56 extend between the first attachment 51 and the second attachment 52 through the middle part 53. The wires 56 serve to electrically connect between the pads 55, and the read elements and write elements of the magnetic head 15 and a heater or another component. In other words, the wires 56 extend between the pads 55 and the electrodes connected to the magnetic heads 15, and serves as at least part of the electrical paths between the pads 55 and the magnetic heads 15.

Figure 3:
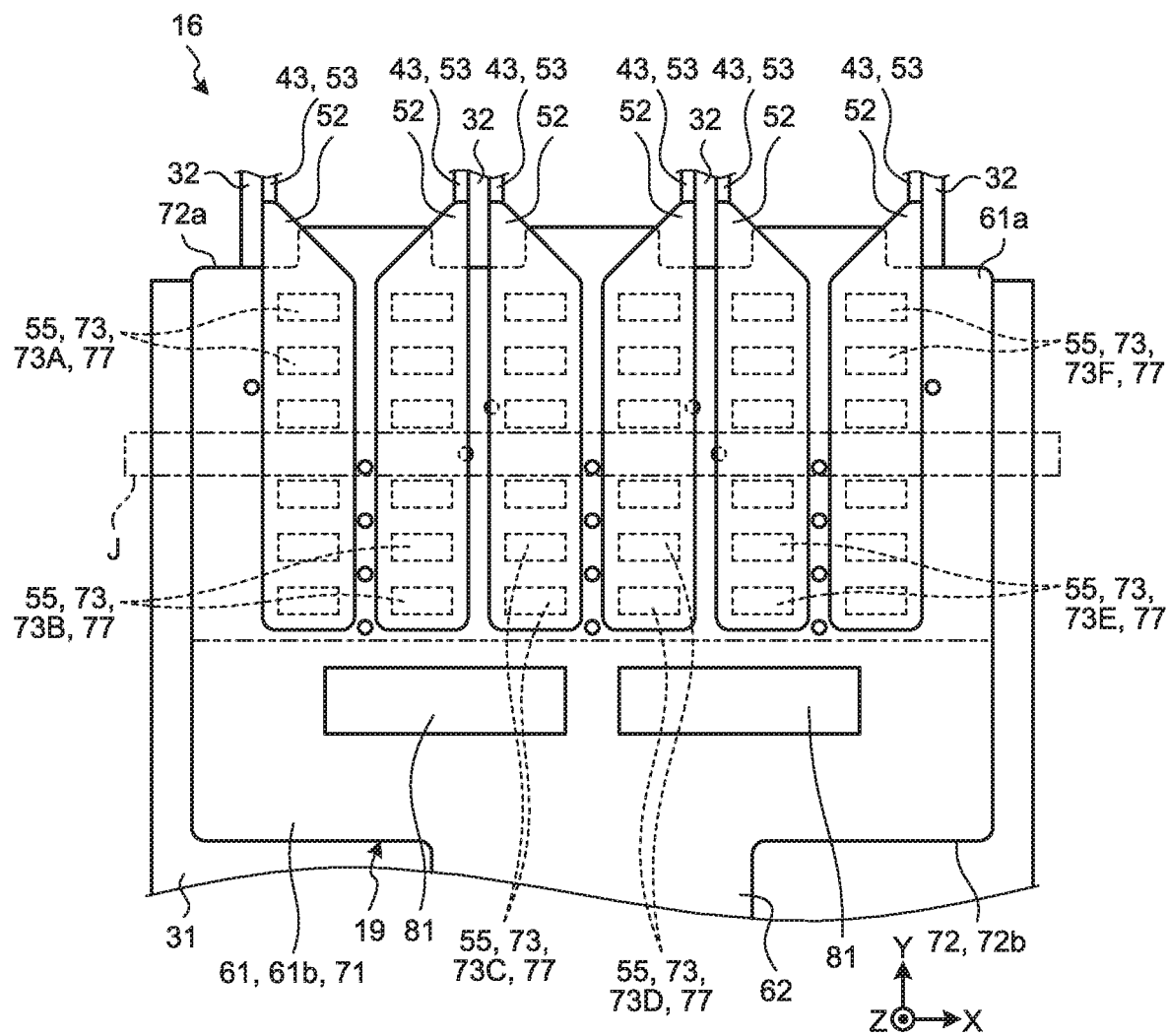
FIG. 3 is an exemplary plan view schematically illustrating part of the FPC and part of the flexures according to the first embodiment.

FIG. 3 is an exemplary plan view schematically illustrating part of the FPC 19 and part of the flexures 43 according to the first embodiment. As illustrated in FIG. 3, the FPC 19 includes a joint 61 and an extension 62. The joint 61 is attached to the actuator block 31, for example. The extension 62 extends between the joint 61 and a printed circuit board on which the control device is mounted.

The second attachments 52 of the flexures 43 are attached to the joint 61 of the FPC 19. The FPC 19 electrically connects the printed circuit board on which the control device is mounted, and the flexures 43. In other words, the control device is electrically connected to the magnetic heads 15 via the printed circuit board, the FPC 19, and the flexures 43.

Figure 4:
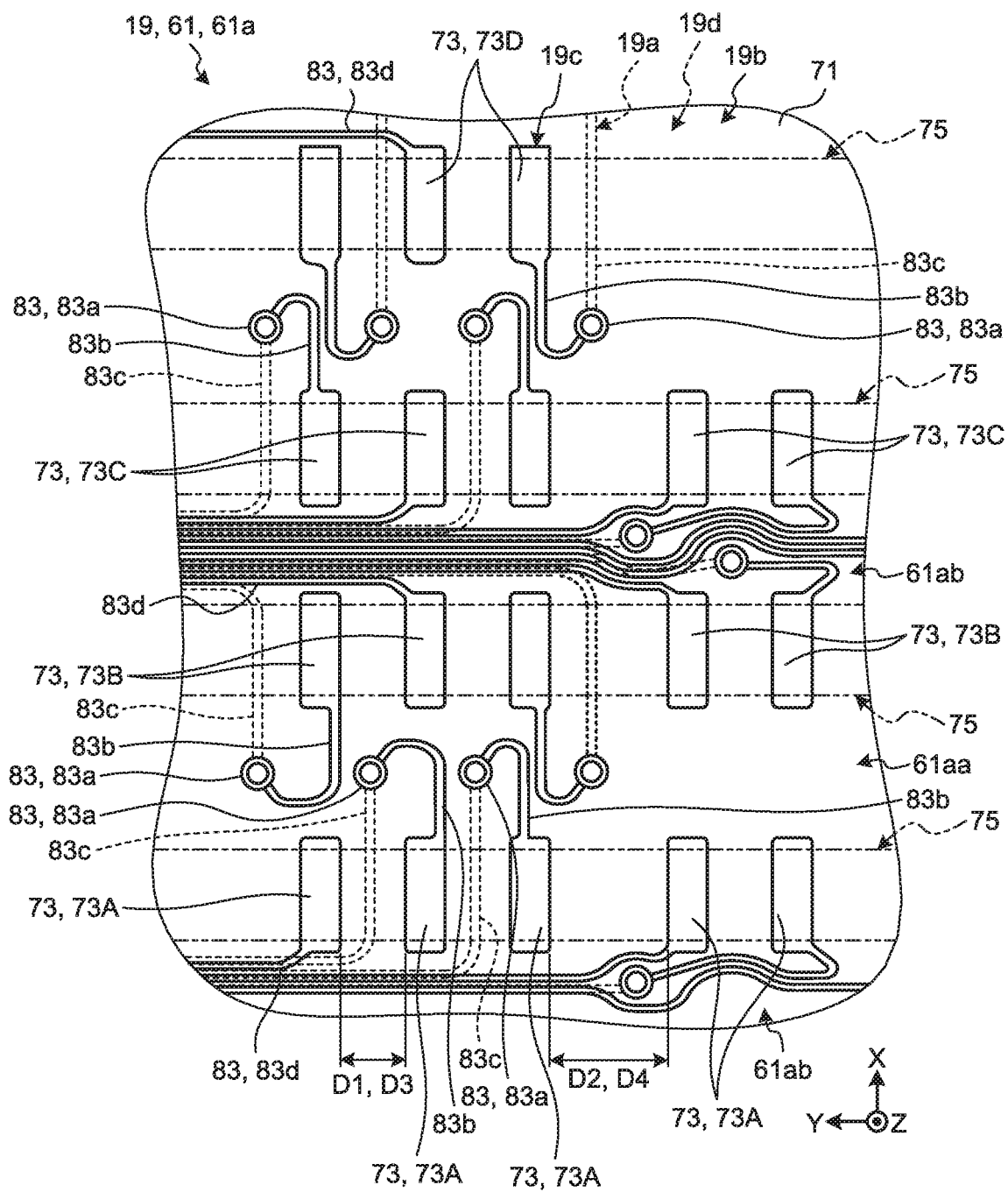
FIG. 4 is an exemplary schematic plan view of part of a joint according to the first embodiment.

FIG. 4 is an exemplary schematic plan view of part of the joint 61 according to the first embodiment. The FPC 19 includes, for example, a first insulating layer, a first conductive layer 19a formed on the first insulating layer, a base layer 19b formed on the first conductive layer 19a, a second conductive layer 19c formed on the base layer 19b, and a second insulating layer 19d formed on the second conductive layer 19c. The layers of the FPC 19 are not limited to this example and may have fewer or more layers. In FIG. 4 the first conductive layer 19a is represented by broken lines, the base layer 19b and the second conductive layer 19c are represented by solid lines, and the second insulating layer 19d are represented by dash-dot-dot lines.

The first conductive layer 19a and the second conductive layer 19c are made from a conductor such as metal. The first insulating layer, the base layer 19b, and the second insulating layer 19d are made from an insulator such as synthetic resin. For example, the first insulating layer, the base layer 19b and the second insulating layer 19d are made from polyimide. In addition, the FPC 19 includes an adhesive layer between every two layers.

In the joint 61, a metal sheet (backing layer) as aluminum is attached to the first insulating layer of the FPC 19. Consequently, the joint 61 is substantially flat. The joint 61 is attached to the actuator block 31 via the metal sheet. As illustrated in FIG. 1, the extension 62 is bent between the joint 61 and the circuit board to be able to absorb the displacement of the joint 61 occurring due to the rotation of the actuator assembly 16.

As illustrated in FIG. 3, the joint 61 of the FPC 19 includes a surface 71, an edge 72, and a plurality of pads 73. The pads 73 are an example of second terminals. The surface 71 of the FPC 19 is formed by, for example, the second insulating layer 19d, and the base layer 19b and the second conductive layer 19c exposed from holes in the second insulating layer 19d. The surface 71 may also be formed of other parts.

As illustrated in the drawings including FIG. 3, in the present specification, an X-axis, Y-axis and Z-axis are defined for the sake of expediency on the premise that the surface 71 be flat. The X-axis, Y-axis, and Z-axis are orthogonal to one another. The X-axis is along the width of the surface 71. The Y-axis is along the length of the surface 71. The Z-axis is orthogonal to the surface 71.

In addition, in the present specification, an X direction, Y direction, and Z direction are defined. The X direction is a direction along the X-axis and includes a +X direction indicated by an X-axis arrow and a −X direction which is the opposite direction of the X-axis arrow. The Y direction is a direction along the Y-axis and includes a +Y direction indicated by a Y-axis arrow and a −Y direction which is the opposite direction of the Y-axis arrow. The Z direction is a direction along the Z-axis and includes a +Z direction indicated by a Z-axis arrow and a −Z direction which is the opposite direction of the Z-axis arrow.

The X direction and Y direction are along the surface 71. The X direction and Y direction intersect each other (orthogonal in the present embodiment). The Z direction is orthogonal to the surface 71. The Y direction is an example of a first direction. The X direction is an example of a second direction.

The joint 61 may also be bent such that the surface 71 is curved or uneven. In this case, the X direction is along the width of the joint 61, and the Y direction is along the length of the joint 61 along the surface 71.

The edge 72 is connected to the end of the surface 71 and faces in a direction substantially orthogonal to the surface 71. The edge 72 includes one edge 72a of the joint 61 and another edge 72b of the joint 61. The edge 72a extends the +Y directional end of the joint 61. The edge 72b is the −Y directional end of the joint 61. The extension 62 extends from the edge 72b of the joint 61.

The pads 73 are mounted on the surface 71. More specifically, as illustrated in FIG. 4, the pads 73 are located on the second conductive layer 19c. The second insulating layer 19d is provided with a plurality of holes 75. The pads 73 are exposed from the holes 75 to the outside of the FPC 19. Thus, the pads 73 are located on the outer face (surface 71) of the FPC 19.

In the example of FIG. 3, the pads 73 are arrayed in six rows in the Y direction. In the following each row of the pads 73 may be individually referred to as the pads 73A, 73B, 73C, 73D, 73E, and 73F. In other words, the pads 73 include the pads 73A, 73B, 73C, 73D, 73E, and 73F. The pad 73A is an example of a first electrode. The pad 73B is an example of a second electrode. The number of rows of the pads 73 corresponds to the number of magnetic disks 12. For example, in the case of the HDD 1 including nine magnetic disks 12, the pads 73 are arranged in nine rows.

In each of the rows, the pads 73 are arranged at intervals in the Y direction. The rows of the pads 73 are arranged at intervals in the X direction. In the example of FIG. 3, each row includes six pads 73. The number of the pads 73 in each row corresponds to the number of the functions of the magnetic heads 15, for example.

The pads 73A, 73B, 73C, 73D, 73E, and 73F are arranged in order in the X direction. The pads 73A are arranged at intervals in the Y direction. The pads 73B are arranged at intervals in the Y direction with spacing from the pads 73A in the +X direction (X direction). Likewise, the pads 73C, 73D, 73E, and 73F are arranged at intervals in the Y direction with spacing from the pads 73 in the preceding row in the +X direction.

The pads 73A and their corresponding pads 73B, 73C, 73D, 73E, and 73F are disposed in substantially the same positions in the Y direction. The corresponding pads 73A, 73B, 73C, 73D, 73E, and 73F may differ in position from one another in the Y direction. The numbers of pads 73 in each row may also differ.

The pads 73A and 73B among the pads 73 will be described below in detail as representative examples. In the following, the pad 73A may be replaced with the pad 73C or the pad 73E, and pad 73B may be replaced with the pad 73D or the pad 73F.

The pads 73 of the FPC 19 are connected to the pads 55 of the flexures 43 with solder 77. The solder 77 is an example of a conductive adhesive. The solder 77 includes a leaded solder or a lead-free solder. The conductive adhesive is not limited to the solder 77 and may be silver paste or wax, for example.

The second attachment 52 of the flexure 43 extends in the Y direction, crossing the edge 72a of the joint 61 to cover the corresponding rows of pads 73. The pads 55 of one flexure 43 are connected to the pads 73 in one row. For example, the pads 55 of one flexure 43 are connected to the pads 73A, and the pads 55 of another flexure 43 are connected to the pads 73B.

The joint 61 includes a joint part 61a and a mount 61b. In FIG. 3, the joint part 61a and the mount 61b are sectioned by a dash-dot-dot line. The joint part 61a is an example of a first part. The mount 61b is an example of a second part. The joint part 61a and the mount 61b are both part of the joint 61.

The joint part 61a is closer to the edge 72a of the joint 61 than the mount 61b. The pads 73 are located on the joint part 61a with spacing from the mount 61b. The mount 61b is closer to the edge 72b of the joint 61 than the joint part 61a.

Two preamplifiers 81 are mounted on the surface 71 of the joint 61. The preamplifiers 81 are an example of an electronic component and a component. The preamplifier 81 may also be referred to as a head integrated circuit (IC) or a head amplifier.

The preamplifiers 81 are mounted on the mount 61b of the joint 61. For example, the terminals of the preamplifiers 81 are connected to the terminals on the surface 71 of the mount 61b. The two preamplifiers 81 are arranged at an interval in the X direction.

As illustrated in FIG. 4, the joint part 61a includes an inner part 61aa between the rows and two outer parts 61ab outside the rows. The inner part 61aa is an example of a third part. The outer parts 61ab are an example of a fourth part. The inner part 61aa and the outer parts 61ab are both part of the joint part 61a.

The inner part 61aa is located between the pads 73A and the pads 73B in the X direction. The inner part 61aa extends in the Y direction along the pads 73A and 73B.

The outer parts 61ab are spaced further from the inner part 61aa than the pads 73A and 73B in the X direction. For example, one outer part 61ab is located between the pads 73A and the edge 72 of the joint 61. The other outer part 61ab is located between the pads 73B and the pads 73C. The outer parts 61ab extend in the Y direction along the pads 73A and 73B.

Figure 5:
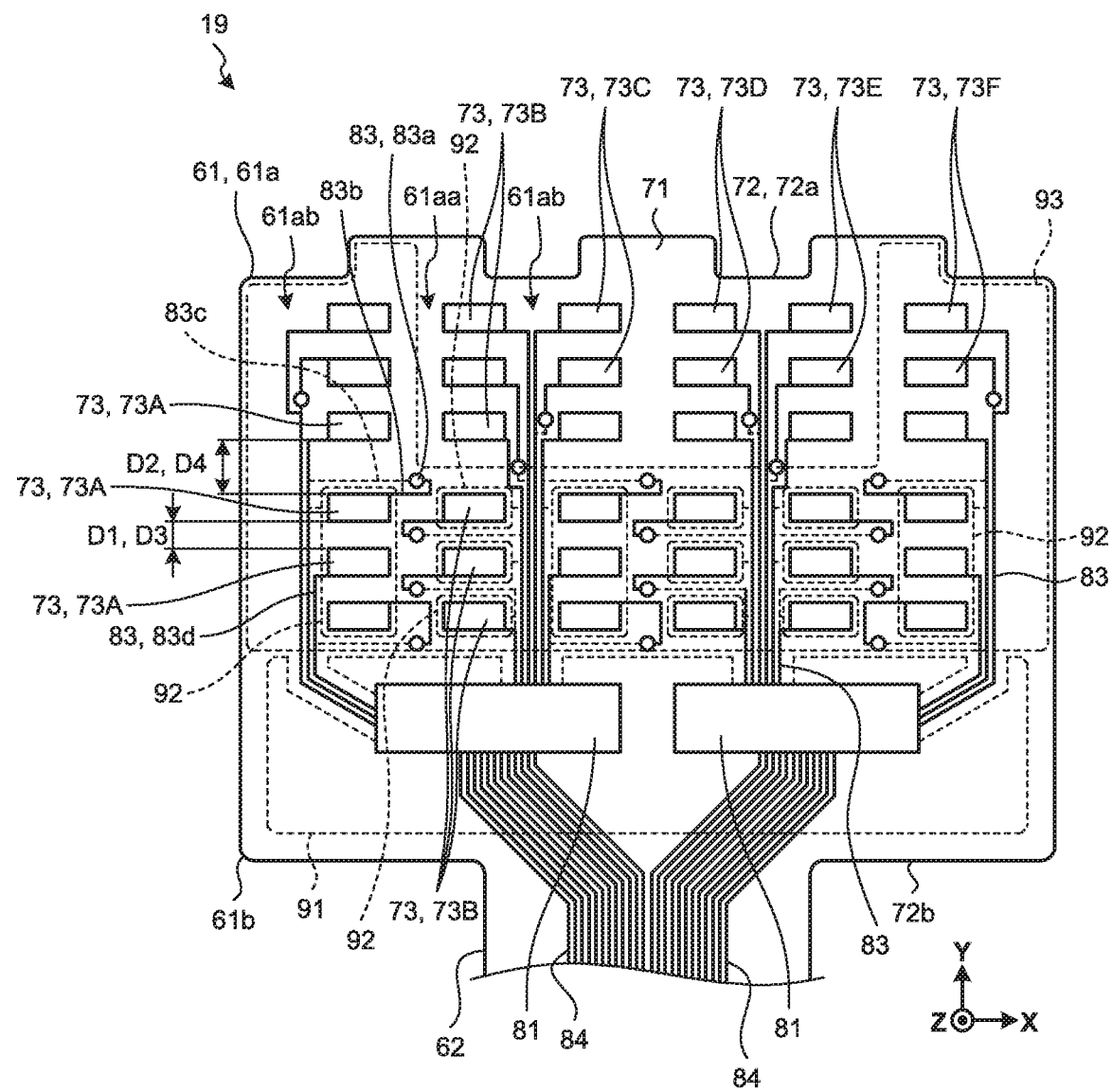
FIG. 5 is an exemplary plan view schematically illustrating part of the FPC according to the first embodiment.

FIG. 5 is an exemplary plan view schematically illustrating part of the FPC 19 according to the first embodiment. FIG. 5 omits depicting the second insulating layer 19d. As illustrated in FIG. 5, the FPC 19 includes a plurality of wires 83 that electrically connects the preamplifiers 81 and the plurality of pads 73, and wires 84 that electrically connect the preamplifiers 81 and the circuit board on which the control device is mounted.

As illustrated in FIG. 4, the wires 83 include a plurality of via holes 83a, a plurality of first wires 83b, a plurality of second wires 83c, and a plurality of third wires 83d. The first wires 83b are an example of second wires. The second wires 83c are an example of third wires.

The via holes 83a include through-connections, plated through-holes, and other types of via holes, for example. The via holes 83a penetrate the base layer 19b and electrically connect the first conductive layer 19a and the second conductive layer 19c. The via holes 83a may also penetrate multiple layers.

At least one of the via holes 83a is located in the inner part 61aa of the joint part 61a. At least one of the via holes 83a in the inner part 61aa is located in the middle of two adjacent pads among the pads 73A in the Y direction. More specifically, the via holes 83a may be partially located in the middle of two adjacent pads among the pads 73A in the Y direction. That is, the cores of the via holes 83a may be apart from the middle of two adjacent pads among the pads 73A in the Y direction. The via holes 83a in the outer parts 61ab may be located in the middle of two adjacent pads among the pads 73A in the Y direction.

As described above, at least one of the via holes 83a is located in the middle of two adjacent ones of the pads 73A in the Y direction. The via hole 83a may also be located in a region between the two adjacent pads 73A in the Y direction, or may be spaced apart in the X direction from the region between the two adjacent pads 73A in the Y direction. In the present embodiment, the via hole 83a is located in the inner part 61ab with spacing in the X direction from the region between the two adjacent pads 73A in the Y direction.

At least one of the via holes 83a in the inner part 61aa is located in the middle of two adjacent pads among the pads 73B in the Y direction. In addition, at least one of the via holes 83a in the inner part 61aa is located at the center between the two adjacent ones of the pads 73A and the two adjacent ones of the pads 73B in the X direction. In other words, at least one of the via holes 83a is located in the center of a region surrounded by the four pads 73A and 73B.

The via holes 83a may include at least one via hole 83a located in a different position from the other via holes 83a. For example, at least one of the via holes 83a may be provided in the outer part 61ab. Furthermore, at least one of the via holes 83a may be spaced apart from the center between the two adjacent pads among the pads 73A in the Y direction.

The first wires 83b are located on the second conductive layer 19c of the FPC 19. The first wires 83b electrically connect the via holes 83a and one corresponding pad among the pads 73. In other words, the first wires 83b extend between the pads 73 and the via holes 83a.

The first wires 83b electrically connect the via holes 83a of the inner part 61aa and the pads 73A, passing a location closer to the pads 73B than the center between the pads 73A and the pads 73B in the X direction. In other words, the first wires 83b connected to the pads 73A extend, crossing the center between the pads 73A and pads 73B in the X direction. The first wiring parts 83b electrically connecting the via holes 83a of the inner part 61aa and the pads 73A are not limited to this example.

The second wires 83c are provided on the first conductive layer 19a of the FPC 19. The second wires 83c extend between the via holes 83a and the preamplifiers 81. Thus, the second wires 83c electrically connect the via holes 83a and the preamplifiers 81. Thus, at least one of the pads 73 and the preamplifiers 81 are electrically interconnected via the wires 83 including the via holes 83a, the first wires 83b and the second wires 83c.

The second wires 83c electrically connecting the via holes 83a of the inner part 61aa to the preamplifiers 81 are connected to the via holes 83a and extend from the inner part 61aa to the outer parts 61ab. The second wires 83c extend in the Y direction in the outer parts 61ab and are connected to the preamplifiers 81. The second wires 83c connected to the via holes 83a extend in the Y direction substantially in parallel to the outer parts 61ab. The second wires 83c may include a part extending in a direction different from the Y direction in the outer parts 61ab.

The third wires 83d are provided on the second conductive layer 19c of the FPC 19. The third wires 83d electrically connect the preamplifier 81 and one corresponding pad among the pads 73. Thus, at least one of the pads 73 and the preamplifiers 81 are electrically interconnected via the wires 83 including the third wires 83d. At least one of the third wires 83d extends in the Y direction substantially in parallel to the outer parts 61ab.

At least two of the pads 55 of the flexure 43 and at least two of the pads 73 of the FPC 19 transmit a differential signal. The via holes 83a, the first wires 83b, and the second wires 83c are electrically connected to one of the pad pair 73 that transmits a differential signal. The third wires 83d are electrically connected to the other of the pad pair 73 that transmits a differential signal. The pads 55 and 73 may transmit an electrical signal different from the differential signal or may include pads 55 and 73 that supply electric power.

In the outer parts 61ab, the second wires 83c and the third wires 83d at least partially overlap each other in the Z direction. In other words, in the outer parts 61ab, the second wires 83c and the third wires 83d cover each other in the Z direction.

Two of the pads 73A are adjacent to each other in the Y direction at a first interval D1. Another two of the pads 73A are adjacent to each other in the Y direction at a second interval D2. The second interval D2 is longer than the first interval D1. The pads 73A are adjacent to each other in the Y direction at the first interval D1 or the second interval D2. Among the pads 73A, a larger number pads 73A are spaced at the first interval D1 than at the second interval D2.

Two of the pads 73B are adjacent to each other in the Y direction at a third interval D3. Another two of the pads 73B are adjacent to each other in the Y direction at a fourth interval D4. The fourth interval D4 is longer than the third interval D3. The pads 73B are adjacent to each other in the Y direction at the third interval D3 or the fourth interval D4. Among the pads 73B, a larger number of pads 73A are spaced at the third interval D3 than at the fourth interval D4.

The length of the first interval D1 is substantially equal to the length of the third interval D3. The length of the second interval D2 is substantially equal to the length of the fourth interval D4. The interval between two adjacent pads 73A and the interval between two adjacent pads 73B are not limited to the foregoing example.

In the Y direction at least one of the via holes 83a is located between the two adjacent pads at the second interval D2 among the pads 73A and between the two adjacent pads at the fourth interval D4 among the pads 73B. The via holes 83a may be spaced apart from the center between the two adjacent pads 73A and from the center between the two adjacent pads 73B in the Y direction.

As illustrated in FIG. 5, the joint 61 of the FPC 19 further includes a first ground plane 91, a plurality of second ground planes 92, and a thermal insulation film 93. The first ground plane 91 is an example of a ground plane. The second ground plane 92 is an example of a conductive layer. The thermal insulation film 93 is an example of a thermal insulation layer. The first ground plane 91 and the second ground planes 92 may be referred to as planes or solid grounds.

The first ground plane 91 is provided on the first conductive layer 19a of the FPC 19. The first ground plane 91 is provided on the mount 61b of the joint 61. Hence, the first ground plane 91 is spaced apart from the pads 73 and the joint part 61a in the −Y direction.

In a Z-directional plan view, the first ground plane 91 is larger in size than the preamplifiers 81. The first ground plane 91 at least partially overlaps the preamplifiers 81 in the Z direction. In other words, the first ground plane 91 covers the preamplifiers 81 in the Z direction. The preamplifiers 81 may be spaced apart from the first ground plane 91 in a direction along the surface 71.

The second ground planes 92 are provided on the first conductive layer 19a of the FPC 19. The second ground planes 92 are made from metal and have a darker color than the base layer 19b and the second insulating layer 19d. Hence, in the FPC 19, the area of the second ground planes 92 exhibits a higher absorbance than the rest of the FPC 19. The FPC 19 may include a part with a higher absorbance than the area of the second ground planes 92.

The second ground planes 92 are provided on the joint part 61a of the joint 61. Hence, the second ground planes 92 are spaced apart from the first ground plane 91 in a direction along the surface 71.

In a Z-direction plan view, the individual second ground planes 92 are larger in size than the individual pads 73. The second ground planes 92 are spaced apart from at least one of the pads 73 in a direction along the surface 71 and cover at least another one of the pads 73 in the Z direction. One of the second ground planes 92 may cover two or more pads 73 in the Z direction.

The second ground planes 92 are electrically connected to the first ground plane 91 via the second wires 83c, for example. Thus, the first ground plane 91 and the second ground planes 92 are both set at ground potential. The second ground planes 92 may be electrically connected to the first ground plane 91 via conductors different from the second wires 83c. Furthermore, the second ground planes 92 may be floating so as to be electrically independent from the first ground plane 91.

The joint 61 may include another dark-color layer or layers instead of the second ground planes 92. For example, the darker-color part of the base layer 19b than the rest thereof may be spaced apart from at least one of the pads 73 in a direction along the surface 71 and cover at least another one of the of pads 73 in the Z direction.

The thermal insulation film 93 is provided, for example, in-between the first conductive layer 19a of the FPC 19 and the first insulating layer or in-between the metal sheet and the first insulating layer. That is, the thermal insulation film 93 is located between the metal sheet with higher thermal conductivity and the first conductive layer 19a.

The thermal insulation film 93 is made from synthetic resin, for example. The thermal insulation film 93 may be made from another material. The thermal insulation film 93 is lower in thermal conductivity than the first conductive layer 19a and the second conductive layer 19c. In addition, the thermal insulation film 93 is equal to or lower in thermal conductivity than the base layer 19b and the second insulating layer 19d.

The thermal insulation film 93 is spaced apart from at least one of the pads 73 in a direction along the surface 71 and covers at least another one of the pads 73 in the Z direction. The thermal insulation film 93 may cover two or more pads 73 in the Z direction.

At least either the second ground planes 92 or the thermal insulation film 93 is spaced apart, in a direction along the surface 71, from the pads 73 which are likely to exhibit a temperature rise by fusing of the solder 77, for example. In addition, at least either the second ground planes 92 or the thermal insulation film 93 covers, in the Z direction, the pads 73 which are unlikely to exhibit a temperature rise by fusing of the solder 77. Temperature change in the pads 73 due to fusing of the solder 77 can be found through experiment or simulation, for example.

An exemplary method for attaching the flexures 43 to the FPC 19 will be described below, however, it is not limited to the one described herein. Other methods may be applied.

First, the pads 55 of the flexure 43 or the pads 73 of the FPC 19 are applied with solder paste containing the solder 77, for example. Then, the joint 61 of the FPC 19 is attached to the actuator block 31 with adhesive and screws, for example.

Next, the head suspension assemblies 33 are attached to the arms 32. As illustrated in FIG. 3, the second attachments 52 of the flexures 43 are disposed on the surface 71 of the joint 61. The pads 55 of the flexures 43 and the pads 73 of the FPC 19 are disposed so as to face each other via the solder paste (solder 77).

Thereafter, the second attachments 52 of the flexures 43 are pressed against the FPC 19 with a jig J. FIG. 3 virtually illustrates the jig J by dash-dot-dot lines. The jig J is located between the two adjacent pads spaced at the second interval D2 among the pads 73A and located between the two adjacent pads spaced at the fourth interval D4 among the pads 73B in the Y direction. The jig J is spaced apart from the pads 55 and 73 in a direction along the surface 71.

The via holes 83a, which are located between the two adjacent pads spaced at the second interval D2 among the pads 73A and between the two adjacent pads spaced at the fourth interval D4 among the pads 73B in the Y direction, are covered by the jig J. In the vicinity of the via holes 83a, the FPC 19 is pressed by the jig J. The jig J may not exert a load on the FPC 19.

Next, the solder paste is fused and the solder 77 mechanically and electrically connects the pads 55 of the flexures 43 and the pads 73 of the FPC 19. For example, of the second attachments 52, the parts having the pads 55 mounted thereon are irradiated with a laser beam. By the laser beam, the pads 55 and 73, the solder paste (solder 77), and the vicinity of thereof are heated to fuse the solder paste. The pads 55 and 73, the solder paste, and the vicinity thereof may be heated with, for example, a pulse heat unit instead of a laser beam.

Typically, when heated, moisture between the layers of the FPC 19 expands. In addition, the layers of the FPC 19 mutually differ in thermal expansion coefficient. For this reason and/or another reason, when the temperature of the FPC 19 exceeds a certain value, the layers of the FPC 19 may detach from one another.

The larger the number of magnetic disks 12 is, the less the numbers and density of the pads 73 and the wires 83 are and the smaller the solder 77 is. Because of this, in the vicinity of the pads 73 and the via holes 83, heat concentration and accumulation readily occur. In addition, the structure of the FPC 19 is complex in the vicinity of the via holes 83a, and the layers are likely to contain moisture in-between them. For this reason, for example, delamination in the FPC 19 is more likely to occur in the vicinity of the pads 73 and the via holes 83a than in other locations.

In the present embodiment, the via holes 83a of the inner part 61aa are located far from the pads 73. In addition, the first wires 83b electrically connecting the via holes 83a of the inner part 61aa and the pads 73 extend long. This can reduce heat transfer from the pads 73 to the via holes 83a and reduce the temperature rise in the via holes 83a and in the vicinity thereof. Thereby, it is possible to reduce a likelihood of occurrence of the delamination of the FPC 19 in the vicinity of the via holes 83*a*.

Typically, if the solder paste (the solder 77) remains at below a certain temperature, the solder paste is not sufficiently fused. Because of this, the pads 55 and the pads 73 may not be sufficiently connected together with the solder 77.

According to the present embodiment, the first ground plane 91 serves to promote heat dissipation and is spaced apart from the pads 73 in a direction along the surface 71. This can avoid heat dissipation from the pads 55 and 73 and the solder paste (the solder 77). Thereby, the solder 77 is heated at a sufficient temperature and adequately fused to mechanically and electrically connect the pads 55 and the pads 73 properly.

In addition, according to the present embodiment, the second ground planes 92 cover, in the Z direction, the pads 73 which is unlikely to exhibit a temperature rise by fusing of the solder 77. In the FPC 19, the part having the second ground planes 92 mounted thereon have a darker color and a higher absorbance than the rest. Hence, the pads 55 and 73 covered by the second ground planes 92, the solder paste (solder 77), and the vicinity thereof are then readily heated by means of a laser beam. Thereby, the solder 77 is heated at a sufficient temperature and adequately fused to mechanically and electrically connect the pads 55 and the pads 73 properly.

In addition, according to the present embodiment, the thermal insulation film 93 covers, in the Z direction, the pads 73 which is unlikely to exhibit a temperature rise by fusing of the solder 77. This can avoid heat dissipation from the pads 55 and 73 and the solder paste (the solder 77) to the metal sheet of the FPC 19, for example. Thereby, the solder 77 is heated at a sufficient temperature and adequately fused to mechanically and electrically connect the pads 55 and the pads 73 properly.

In addition, according to the present embodiment, the second ground planes 92 and the thermal insulation film 93 are spaced apart, in a direction along the surface 71, from the pads 73 which is likely to rise in temperature by fusing of the solder 77. This can reduce the temperature rise in the pads 73 and reduce a likelihood of occurrence of the delamination of the FPC 19 in the vicinity of the pads 73.

By the method as above, the flexures 43 are attached to the FPC 19. The flexures 43 may be individually or collectively subjected to the foregoing procedures.

According to the HDD 1 of the first embodiment described above, the FPC 19 includes the surface 71, the pads 73 mounted on the surface 71 and connected to the pads 55 by means of the solder 77, and the first ground plane 91 spaced apart from the pads 73 in a direction along the surface 71. The first ground plane 91 is made from metal and has a high thermal conductivity. Hence, typically, the vicinity of the first ground plane 91 is readily coolable. According to the present embodiment, the first ground plane 91 is spaced apart from the pads 73, so that the solder 77 readily rises in temperature to the fusing point at the time of connecting the pads 73 to the pads 55 by means of the solder 77. Thus, according to the HDD 1 of the present embodiment, the FPC 19 is readily adjustable in temperature at the time of connecting the pads 55 and 73. This can avoid degradation of the quality of the FPC 19, such as a loose connection between the pads 55 and 73 due to insufficient fusing of the solder 77. In addition, the first ground plane 91 can be reduced in size, enabling cost reduction of the HDD 1.

The FPC 19 includes the joint part 61*a* on which the pads 73 are mounted, and the mount 61*b* on which the preamplifiers 81 are mounted. The first ground plane 91 is placed on the mount 61*b* with spacing from the joint part 61*a* in a direction along the surface 71. That is, the first ground plane 91 is further away from the pads 73, enabling the solder 77 to rise in temperature to the fusing point at the time of connecting the pads 73 to the pads 55 by means of the solder 77. Thus, according to the HDD 1 of the present embodiment, the FPC 19 is readily adjustable in temperature at the time of connecting the pads 55 and 73. This can avoid degradation of the quality of the FPC 19, such as a loose connection between the pads 55 and 73 due to insufficient fusing of the solder 77.

The pads 73 include the pads 73A arranged at intervals in the Y direction along the surface 71. The FPC 19 includes the via holes 83*a* and the first wires 83*b* which electrically connect the via holes 83*a* and one of the pads 73A. The via holes 83*a* are located in the middle of two adjacent pads among the pads 73A in the Y direction. In other words, in the Y direction the distances between the via holes 83*a* and the two pads 73A closest to the via holes 83*a* are substantially the same distance. That is, the via holes 83*a* are disposed farthest from the two adjacent pads 73A in the Y direction. Typically, at the temperature above a certain value in the vicinity of the via holes 83*a*, delamination may occur in the FPC 19. According to the present embodiment, the via holes 83*a* are disposed far from the pads 73A, so that it is possible to decrease a temperature rise in the via holes 83*a* at the time of connecting the pads 73 to the pads 55 by means of the solder 77. Thus, according to the HDD 1 of the present embodiment, the FPC 19 is readily adjustable in temperature at the time of connecting the pads 55 and 73. This can avoid degradation of the quality of the FPC 19, such as the delamination of the FPC 19 due to the temperature rise in the vicinity of the via holes 83*a*.

The pads 73 include the pads 73B arranged at intervals in the Y direction with spacing from the pads 73A in the X direction intersecting the Y direction and along the surface 71. The via holes 83*a* are located in the middle of two adjacent pads among the pads 73A in the Y direction, in the middle of two adjacent pads among the pads 73B in the Y direction, and between the two adjacent pads 73A and the two adjacent pads 73B in the X direction. That is, the via holes 83*a* are located farthest from the two adjacent pads 73A and the two adjacent pads 73B in-between them in the Y direction. In addition, the via holes 83*a* are disposed farthest from the pads 73A and the pads 73B in-between them in the X direction. Owing to the far location of the via holes 83*a* from the pads 73A and the pads 73B, a temperature rise in the via holes 83*a* can be lowered at the time of connecting the pads 73 to the pads 55 by means of the solder 77. Thus, according to the HDD 1 of the present embodiment, the FPC 19 is readily adjustable in temperature at the time of connecting the pads 55 and 73. This can avoid degradation of the quality of the FPC 19, such as the delamination of the FPC 19 due to a temperature rise in the vicinity of the via holes 83*a*.

The first wires 83*b* electrically connect the via holes 83*a* and one of the pads 73A through the location closer to the pads 73B than the center between the pads 73A and the pads 73B in the X direction. This allows the first wires 83*b* to extend long, reducing the thermal conductivity between the pads 73A and the via holes 83*a* and hence reducing a temperature rise in the via holes 83*a* at the time of connecting the pads 73 to the pads 55 by means of the solder 77. Thus, according to the HDD 1 of the present embodiment, the FPC 19 is readily adjustable in temperature at the time of connecting the pads 55 and 73. This can avoid degradation of the quality of the FPC 19, such as the delamination of the FPC 19 due to the temperature rise in the vicinity of the via holes 83a.

The FPC 19 includes the inner part 61aa, the outer parts 61ab, and the second wires 83c. The inner part 61aa is located between the pads 73A and the pads 73B in the X direction and provided with the via holes 83a. The outer parts 61ab are spaced further from the inner part 61aa than the pads 73A in the X direction. The second wires 83c are electrically connected to the via holes 83a, extend in the Y direction in the outer parts 61ab, and electrically connect the preamplifiers 81 and the via holes 83a. That is, the via holes 83a are disposed in a concentrated manner in the inner part 61aa, and the second wires 83c extend in the Y direction in a concentrated manner in the outer parts 61ab. The wiring design of the FPC 19 can thus be simplified.

Among the pads 73A, two pads are adjacent to each other at the first interval D1, and another two pads are adjacent to each other at the second interval D2 longer than the first interval D1. Among the pads 73B, two pads are adjacent to each other at the third interval D3, and another two pads are adjacent to each other at the fourth interval D4 longer than the third interval D3. This arrangement allows the jig J for pressing the flexures 43 against the FPC 19 to be disposed in the region between the two adjacent pads 73A at the second interval D2 and in the region between the two adjacent pads 73B at the fourth interval D4. In the Y direction the via holes 83a are located between the two adjacent pads 73A at the second interval D2 and between the two adjacent pads 73B at the fourth interval D4. This arrangement allows the jig J to be able to press the FPC 19 in the vicinity of the via holes 83a, leading to preventing the delamination of the FPC 19 in the vicinity of the via holes 83a.

The pads 55 and 73 are configured to transmit a differential signal. This eliminates the necessity to place the first ground plane 91 on the wires 83 electrically connected to the pads 73, and allow the first ground plane 91 to be separated from the pads 73. Thereby, the solder 77 can readily rise in temperature to the fusing point at the time of connecting the pads 73 to the pads 55 by means of the solder 77. This can avoid degradation of the quality of the FPC 19, such as a loose connection between the pads 55 and 73 due to insufficient fusing of the solder 77. In addition, in the circuitry that transmits a differential signal, typically, the substrate may be provided with the via holes 83a in order to overlay two wires along the thickness of the substrate. In the present embodiment, the via holes 83a are disposed farthest from the two pads 73A in-between them in the Y direction. Thereby, the temperature rise in the via holes 83a is reduced at the time of connecting the pads 73 to the pads 55 by means of the solder 77. This can avoid degradation of the quality of the FPC 19, such as the delamination of the FPC 19 due to the temperature rise in the vicinity of the via holes 83a.

The FPC 19 includes the second ground planes 92. The second ground planes 92 are spaced apart from one of the pads 73 in a direction along the surface 71 and cover another one of the pads 73 in a direction orthogonal to the surface 71. In the FPC 19, typically, the part having the first ground plane 91 mounted thereon has a dark color. The dark-colored parts are readily heated by means of a laser beam, for example, due to a high absorbance. By placing the second ground planes 92 away from the not-readily coolable pads 73 to cover the readily coolable pads 73, for example, the temperature of the solder 77 on the pads 73 can be adjusted at the time of connecting the pads 73 to the pads 55 by means of the solder 77 fused by a laser beam. Thus, according to the HDD 1 of the present embodiment, the FPC 19 is readily adjustable in temperature at the time of connecting the pads 55 and 73. This can avoid degradation of the quality of the FPC 19, such as a loose connection or the delamination.

The second ground planes 92 are electrically connected to the first ground plane 91. This can prevent the second ground planes 92 from undesirably functioning as antennas.

The FPC 19 includes the thermal insulation film 93. The thermal insulation film 93 is spaced apart from one of the pads 73 in a direction along the surface 71 and covers another one of the pads 73 in a direction orthogonal to the surface 71. For example, by placing the thermal insulation film 93 apart from the not-readily coolable pads 73 to cover the readily coolable pads 73 at the time of connecting the pads 73 to the pads 55 by means of the solder 77, the temperature of the solder 77 on the pads 73 can be adjusted. Thus, according to the HDD 1 of the present embodiment, the FPC 19 is readily adjustable in temperature at the time of connecting the pads 55 and 73. This can avoid degradation of the quality of the FPC 19, such as a loose connection or delamination.

Second Embodiment

A second embodiment will be described below with reference to FIG. 6. In the following embodiment, constituent elements having the same functions as the constituent elements already described are denoted by the same reference numbers and descriptions thereof may be omitted. The constituent elements denoted by the same reference signs may not have all functions and properties in common and may have dissimilar functions and properties according to each of the embodiments.

Figure 6:
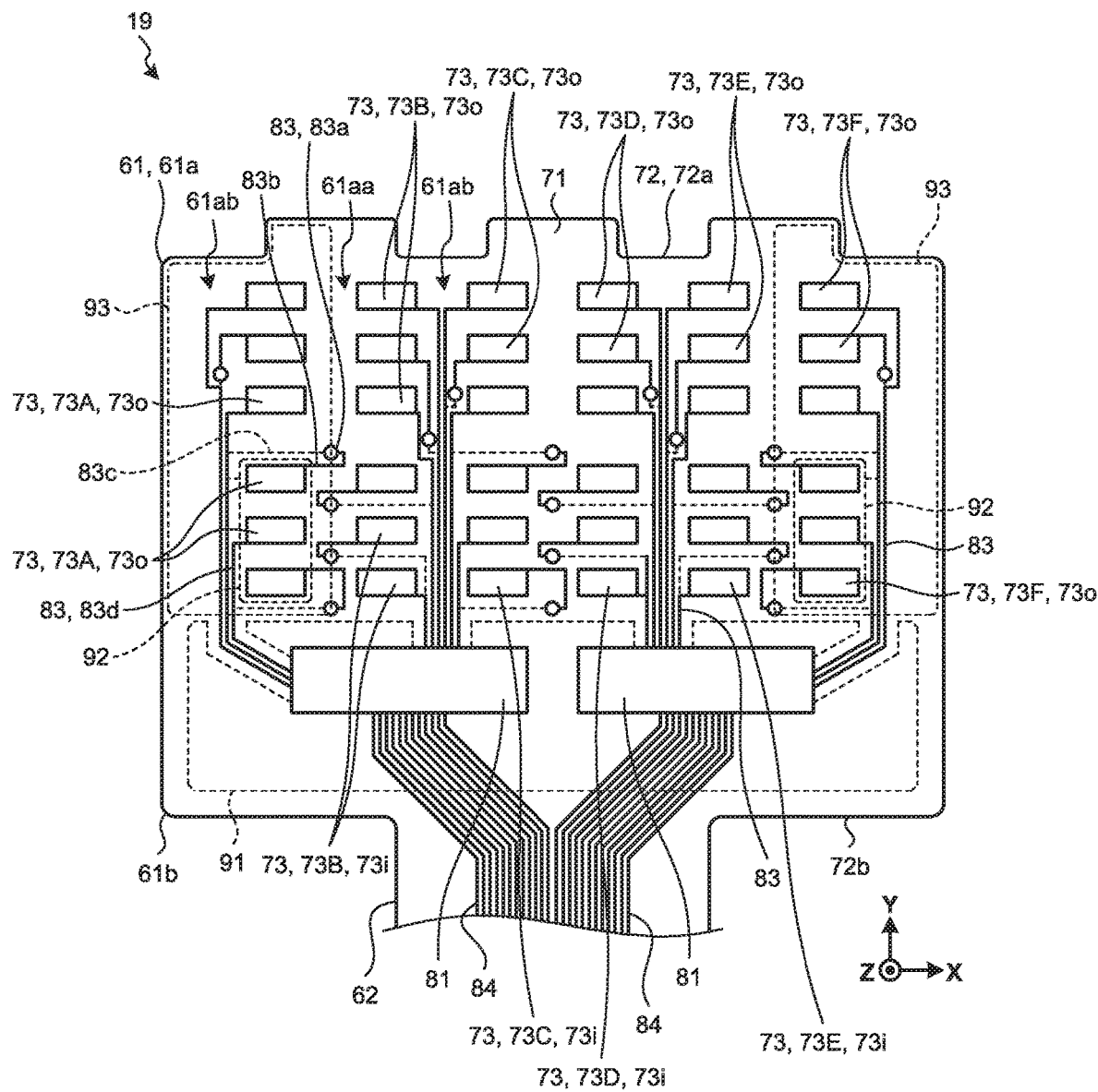
FIG. 6 is an exemplary plan view schematically illustrating part of the FPC according to a second embodiment.

FIG. 6 is an exemplary plan view schematically illustrating part of the FPC 19 according to the second embodiment. FIG. 6 omits depicting the second insulating layer 19d. As illustrated in FIG. 6, the pads 73 include a plurality of inner pads 73i and a plurality of outer pads 73o. The inner pad 73i is an example of an inner terminal. The outer pad 73o is an example of an outer terminal.

The inner pads 73i among the pads 73 are located in the vicinity of the central part of the joint 61. The outer pads 73o among the pads 73 are located in the outer periphery of the joint 61. That is, the outer pads 73o are closer to the edge 72 of the joint 61 than the inner pads 73i.

For example, the pads 73A and 73F are the outer pads 73o. The pads 73B, 73C, 73D, and 73E include the inner pads 73i and the outer pads 73o.

The second ground planes 92 and the thermal insulation film 93 are spaced apart from at least one of the inner pads 73i in a direction along the surface 71 and cover at least one of the outer pads 73o in a direction orthogonal to the surface 71. Depending on a temperature change in the pads 73 at the time of fusing the solder 77, at least either of the second ground planes 92 and the thermal insulation film 93 may be spaced apart from at least one of the outer pads 73o in a direction along the surface 71 and may cover at least one of the inner pads 73i in a direction orthogonal to the surface 71.

According to the HDD 1 of the second embodiment, the pads 73 include the inner pads 73i and the outer pads 73o closer to the edge 72 of the FPC 19 than the inner pads 73i. The second ground planes 92 are spaced apart from the inner pads 73i in a direction along the surface 71 and cover the outer pads 73o in a direction orthogonal to the surface 71. Typically, the outer pads 73o can dissipate heat from the edge 72 of the FPC 19 and are thus readily coolable. The inner pads 73i are far from the edge 72 of the FPC 19 and are thus not readily coolable. According to the present embodiment, by placing the second ground planes 92 apart from the inner pads 73i to cover the outer pads 73o, the solder 77 on the outer pads 73o can readily rise in temperature to the fusing point at the time of connecting the pads 73 to the pads 55 by means of the solder 77. In addition, the temperature rise in the solder 77 on the inner pads 73i is reduced. Thus, according to the HDD 1 of the present embodiment, the FPC 19 is readily adjustable in temperature at the time of connecting the pads 55 and 73. This can avoid degradation of the quality of the FPC 19, such as a loose connection or delamination.

The thermal insulation film 93 is spaced apart from the inner pads 73i in a direction along the surface 71 and covers the outer pads 73o in a direction orthogonal to the surface 71. Hence, at the time of connecting the pads 73 to the pads 55 by means of the solder 77, the temperature of the solder 77 on the outer pads 73o readily rises to the fusing point. In addition, the rise in temperature of the solder 77 on the inner pads 73i is reduced. Thus, according to the HDD 1 of the present embodiment, the FPC 19 is readily adjustable in temperature at the time of connecting the pads 55 and 73. This can avoid degradation of the quality of the FPC 19, such as a loose connection or delamination.

In the HDD 1, the via holes 83a and the first ground plane 91 may be disposed in a different manner from at least one of the first and second embodiments. Furthermore, the HDD 1 may exclude at least either of the second ground planes 92 and the thermal insulation film 93. By such modification, the FPC 19 is readily adjustable in temperature at the time of connecting the pads 55 and 73.

According to at least one of the first and second embodiments, the flexible printed circuit board includes a surface; a plurality of second terminals located on the surface to be connected to a plurality of first terminals by means of a conductive adhesive; and a ground plane spaced apart from the second terminals in a direction along the surface. The ground plane is made from metal and has a higher thermal conductivity. Hence, typically, the vicinity of the ground plane is readily coolable. According to the present embodiment, due to the location of the ground plane apart from the second terminals, the temperature of the solder readily rises to the fusing point at the time of connecting the second terminals to the first terminals by means of a conductive adhesive such as solder. That is, according to the disk device of the present embodiment, the temperature of the flexible printed circuit board is readily adjustable in connecting the first terminals to the second terminals. This makes it possible to avoid degradation of the quality of the flexible printed circuit board, such as a loose connection between the first terminals and the second terminals due to insufficient fusing of the solder. In addition, the ground plane can be reduced in size, enabling cost reduction of the disk device.

At least one of the above embodiments includes at least the following features.

(1) A disk device includes a recording medium of a disk form including a recording layer; a magnetic head configured to read and write information from and to the recording medium; a wiring member including a plurality of first terminals, and a plurality of first wires that electrically connect the magnetic head to the plurality of first terminals; and a flexible printed circuit board including a surface, a plurality of second terminals located on the surface to be connected to the plurality of first terminals by means of a conductive adhesive, and a ground plane spaced apart from the plurality of second terminals in a direction along the surface.

(2) A disk device includes a recording medium of a disk form including a recording layer; a magnetic head configured to read and write information from and to the recording medium; a wiring member including a plurality of first terminals, and a plurality of first wires that electrically connect the magnetic head and the plurality of first terminals; and a flexible printed circuit board including a surface, and a plurality of second terminals located on the surface to be connected to the plurality of first terminals by means of a conductive adhesive, wherein the plurality of second terminals include a plurality of first electrodes arranged at intervals in a first direction along the surface, the flexible printed circuit board is provided with a via hole and a second wire that electrically connects the via hole and one of the plurality of first electrodes, and the via hole is located in the middle of two adjacent first electrodes among the plurality of first electrodes in the first direction.

(3) A disk device includes a recording medium of a disk form including a recording layer; a magnetic head configured to read and write information from and to the recording medium; a wiring member including a plurality of first terminals, and a plurality of first wires that electrically connect the magnetic head and the plurality of first terminals; and a flexible printed circuit board including a surface, a plurality of second terminals located on the surface to be connected to the plurality of first terminals by means of a conductive adhesive, and a conductive layer spaced apart from one of the plurality of second terminals in a direction along the surface and covering another one of the plurality of second terminals in a direction orthogonal to the surface.

(4) A disk device includes a recording medium of a disk form including a recording layer; a magnetic head configured to read and write information from and to the recording medium; a wiring member including a plurality of first terminals, and a plurality of first wires that electrically connect the magnetic head and the plurality of first terminals; and a flexible printed circuit board including a surface, a plurality of second terminals located on the surface to be connected to the plurality of first terminals by means of a conductive adhesive, and a thermal insulation layer spaced apart from one of the plurality of second terminals in a direction along the surface and covering another one of the plurality of second terminals in a direction orthogonal to the surface.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A disk device, comprising:
   a recording medium;
   a magnetic head configured to read and write information from and to the recording medium;
   a wiring member comprising a plurality of first terminals, and a plurality of first wires that electrically connect the magnetic head and the plurality of first terminals; and
   a flexible printed circuit board comprising:

a surface,
a plurality of second terminals located on the surface to be connected to the plurality of first terminals by means of a conductive adhesive, and
a ground plane spaced apart from the plurality of second terminals in a direction along the surface, wherein
the flexible printed circuit board includes a conductive layer,
the conductive layer is spaced apart from one of the plurality of second terminals in the direction along the surface, and covers another one of the plurality of second terminals in the direction orthogonal to the surface,
the plurality of second terminals include an inner terminal, and an outer terminal located closer to an edge of the flexible printed circuit board than the inner terminal, and
the conductive layer is spaced apart from the inner terminal in the direction along the surface, and covers the outer terminal in the direction orthogonal to the surface.

2. The disk device according to claim 1, further comprising:
an electronic component mounted on the flexible printed circuit board,
wherein the flexible printed circuit board comprises:
a first part on which the plurality of second terminals are located, and
a second part on which the electronic component is mounted, and
the ground plane is located on the second part with spacing from the first part in the direction along the surface.

3. The disk device according to claim 1,
wherein the plurality of second terminals include a plurality of first electrodes arranged at intervals in a first direction along the surface,
the flexible printed circuit board is provided with a via hole, and a second wire that electrically connects the via hole and one of the plurality of first electrodes, and
the via hole is located in the middle of two adjacent first electrodes among the plurality of first electrodes in the first direction.

4. The disk device according to claim 3,
wherein the plurality of second terminals include a plurality of second electrodes that are arranged at intervals in the first direction with spacing from the plurality of first electrodes in a second direction, the second direction being along the surface and intersecting the first direction, and
the via hole is located in the middle of two adjacent first electrodes among the plurality of first electrodes in the first direction, in the middle of two adjacent second electrodes among the plurality of second electrodes in the first direction, and in the middle of the two adjacent first electrodes and the two adjacent second electrodes in the second direction.

5. The disk device according to claim 4,
wherein the second wire electrically connects the via hole and one of the plurality of first electrodes through a location closer to the plurality of second electrodes than a center between the plurality of first electrodes and the plurality of second electrodes in the second direction.

6. The disk device according to claim 4,
wherein the flexible printed circuit board comprises a third part, a fourth part, and a plurality of third wires,
the third part is provided with a plurality of via holes, and is located between the plurality of first electrodes and the plurality of second electrodes in the second direction,
the fourth part is spaced further from the third part than the plurality of first electrodes in the second direction, and
the plurality of third wires are electrically connected to the plurality of via holes, extend in the first direction in the fourth part, and electrically connect a component mounted on the flexible printed circuit board and the plurality of via holes.

7. The disk device according to claim 1,
wherein the plurality of second terminals include:
a plurality of first electrodes arranged at intervals in a first direction along the surface, and
a plurality of second electrodes arranged at intervals in the first direction with spacing from the plurality of first electrodes in a second direction, the second direction being along the surface and intersecting the first direction,
the flexible printed circuit board is provided with a via hole, and a second wire that electrically connects the via hole and one of the plurality of first electrodes,
two of the plurality of first electrodes are adjacent to each other at a first interval,
another two of the plurality of first electrodes are adjacent to each other at a second interval longer than the first interval,
two of the plurality of second electrodes are adjacent to each other at a third interval,
another two of the plurality of second electrodes are adjacent to each other at a fourth interval longer than the third interval, and
the via hole is located between the two adjacent first electrodes at the second interval and between the two adjacent second electrodes at the fourth interval in the first direction.

8. The disk device according to claim 1,
wherein the plurality of first terminals and the plurality of second terminals are configured to transmit a differential signal.

9. The disk device according to claim 1,
wherein the conductive layer is electrically connected to the ground plane.

10. The disk device according to claim 1,
wherein the flexible printed circuit board includes a thermal insulation layer, and
the thermal insulation layer is spaced apart from one of the plurality of second terminals in the direction along the surface, and covers another one of the plurality of second terminals in the direction orthogonal to the surface.

11. The disk device according to claim 10,
wherein the thermal insulation layer is spaced apart from the inner terminal in the direction along the surface, and covers the outer terminal in the direction orthogonal to the surface.

* * * * *